(12) United States Patent
Togawa et al.

(10) Patent No.: US 10,388,527 B2
(45) Date of Patent: Aug. 20, 2019

(54) METHOD OF MANUFACTURING SEMICONDUCTOR DEVICE

(71) Applicant: TOYOTA JIDOSHA KABUSHIKI KAISHA, Toyota-shi, Aichi (JP)

(72) Inventors: Norihiro Togawa, Nagoya (JP); Narumasa Soejima, Nagakute (JP); Shoji Mizuno, Kariya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/726,603

(22) Filed: Oct. 6, 2017

(65) Prior Publication Data
US 2018/0144938 A1    May 24, 2018

(30) Foreign Application Priority Data
Nov. 21, 2016 (JP) .................. 2016-226171

(51) Int. Cl.
| | | |
|---|---|---|
| *H01L 21/04* | (2006.01) |
| *H01L 21/265* | (2006.01) |
| *H01L 29/66* | (2006.01) |
| *H01L 29/16* | (2006.01) |
| *H01L 29/872* | (2006.01) |

(52) U.S. Cl.
CPC ........ *H01L 21/0495* (2013.01); *H01L 21/046* (2013.01); *H01L 29/66143* (2013.01); *H01L 21/26506* (2013.01); *H01L 29/1608* (2013.01); *H01L 29/6606* (2013.01); *H01L 29/872* (2013.01)

(58) Field of Classification Search
None
See application file for complete search history.

(56) References Cited

U.S. PATENT DOCUMENTS

| | | | | |
|---|---|---|---|---|
| 7,122,488 B2 * | 10/2006 | Joshi | .................. | C23C 16/0272 438/788 |
| 2002/0179909 A1 * | 12/2002 | Uchida | ............. | H01L 29/66143 257/73 |
| 2010/0244049 A1 | 9/2010 | Yamamoto et al. | | |

FOREIGN PATENT DOCUMENTS

JP    2010-225877 A    10/2010

* cited by examiner

*Primary Examiner* — Bo B Jang
(74) *Attorney, Agent, or Firm* — Oliff PLC

(57) ABSTRACT

A method of manufacturing a semiconductor device is provided with: implanting charged particles including oxygen into a surface of a SiC wafer; and forming a Schottky electrode that makes Schottky contact with the SiC wafer on the surface after the implantation of the charged particles.

2 Claims, 7 Drawing Sheets

METHOD OF MANUFACTURING SEMICONDUCTOR DEVICE

TECHNICAL FIELD

The technology disclosed in the present teachings relates to a method of manufacturing a semiconductor device.

BACKGROUND

Japanese Patent Application Publication No. 2010-225877 discloses a technology of forming a Schottky electrode on a surface of a SiC wafer (a semiconductor wafer containing SiC (silicon carbide) as a main material thereof). In this technology, a portion of the Schottky electrode that is in contact with the SiC water is constituted of a metal oxide. According to this technology, a barrier height of the Schottky electrode can be increased.

SUMMARY

A barrier height of a Schottky electrode changes depending on an amount of oxygen that exists in an interface (hereinafter referred to as a Schottky interface) between the Schottky electrode and a SiC wafer. In the technology of forming a metal oxide as in Japanese Patent Application Publication No. 2010-225877, the amount of oxygen that exists in the Schottky interface cannot be controlled accurately. Accordingly, the technology in Japanese Patent Application Publication No. 2010-225877 has a problem of large variations in barrier heights of the Schottky electrodes when semiconductor devices are mass-produced.

A method of manufacturing a semiconductor device disclosed herein may comprise: implanting charged particles including oxygen into a surface of a SiC wafer; and forming a Schottky electrode that makes Schottky contact with the SiC wafer on the surface after the implantation of the charged particles.

In this manufacturing method, the charged particles including oxygen are implanted into the surface of the SiC wafer, and subsequently, the Schottky electrode is formed on the surface. Accordingly, the oxygen implanted into the surface of the SiC wafer is captured into the Schottky interface. According to this method, the amount of oxygen that exists in the Schottky interface can be controlled accurately. Therefore, according to this method, variations in barrier heights of the Schottky electrodes can be suppressed when semiconductor devices are mass-produced.

DETAILED DESCRIPTION

Embodiment 1

Figure 1:
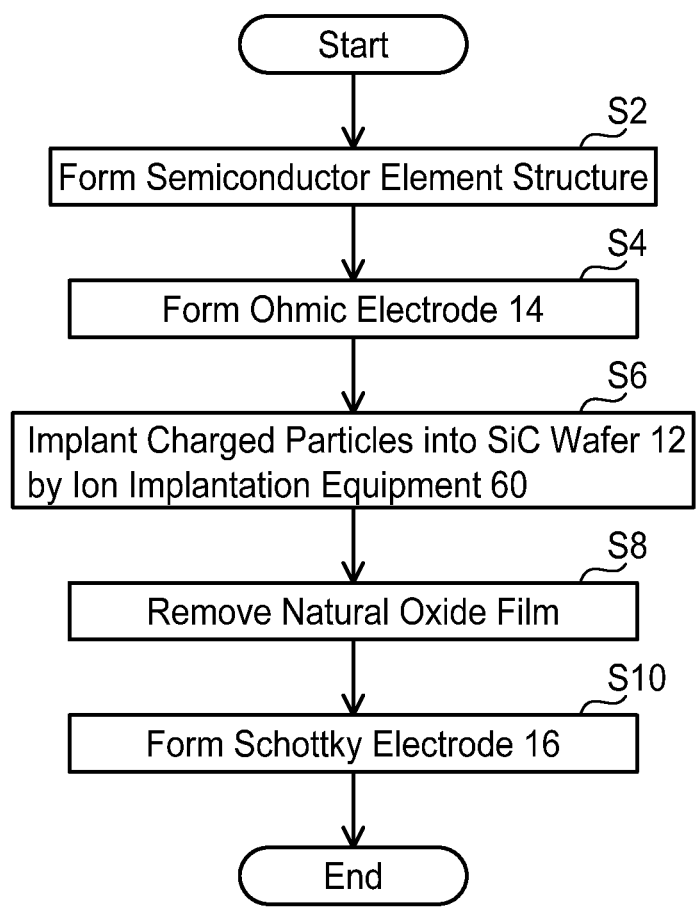
FIG. 1 is a flowchart illustrating a manufacturing method in Embodiment 1.

In Embodiment 1, a semiconductor device that has a Schottky electrode is manufactured. The manufactured semiconductor device may be a Schottky barrier diode (hereinafter referred to as an SBD), or a semiconductor device in which the SBD and another semiconductor element are combined, or another semiconductor device that has a Schottky electrode. FIG. 1 is a flowchart illustrating a method of manufacturing the semiconductor device in Embodiment 1.

In step S2, a semiconductor element structure is formed inside a SiC wafer.

Figure 2:
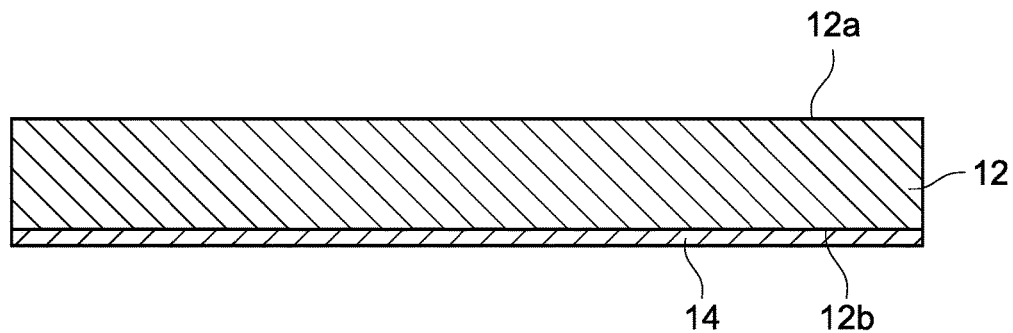
FIG. 2 is a cross-sectional view of a SiC wafer.

In step S4, as shown in FIG. 2, an ohmic electrode 14 is formed on a lower surface 12b of a SiC wafer 12.

Figure 3:
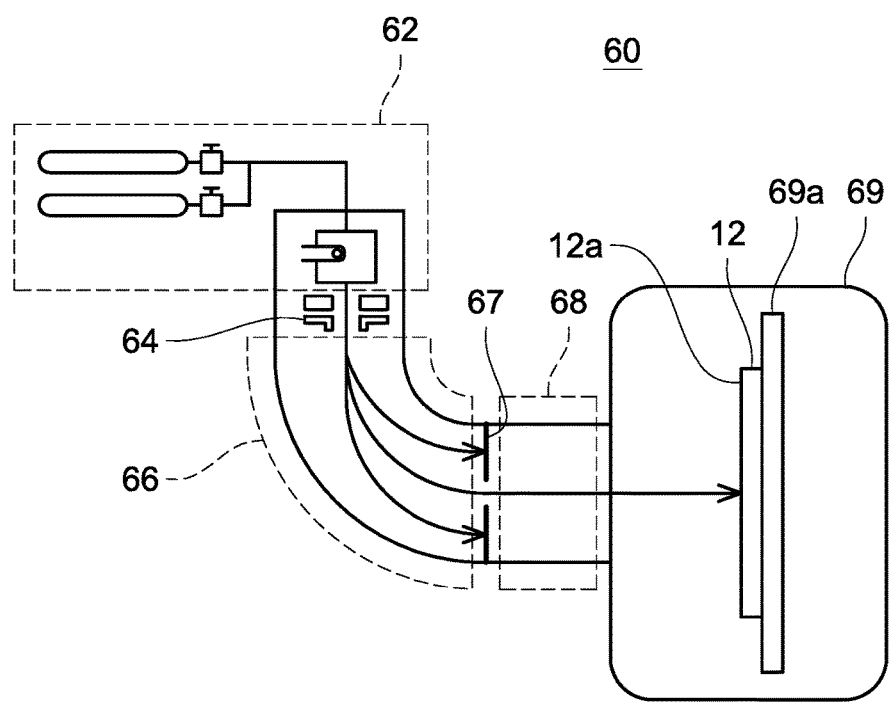
FIG. 3 is a schematic diagram of an ion implantation equipment.

In step S6, charged particles are implanted into an upper surface 12a of the SiC wafer 12. FIG. 3 illustrates an ion implantation equipment 60 used in step S6. The ion implantation equipment 60 comprises an ion source 62, an extraction electrode 64, a mass-analyzer magnet 66, a slit plate 67, an accelerator 68, and a chamber 69. In the chamber 69, a stage 69a is provided. The SiC wafer 12 is mounted on the stage 69a in an orientation that allows the upper surface 12a to be exposed. The ion source 62 has a tank that stores material gas including oxygen. The ion source 62 decomposes the material gas to generate ions. The generated ions include oxygen ions or molecular ions that include oxygen. The oxygen ions or the molecular ions that include oxygen will be hereinafter referred to as oxygen-containing ions. The ions generated in the ion source 62 are guided into the mass-analyzer magnet 66 by an electric field of the extraction electrode 64. In the mass-analyzer magnet 66, the oxygen-containing ions and other ions are guided to different paths by a magnetic field. The ions other than the oxygen-containing ions collide against the slit plate 67, and the oxygen-containing ions pass through the slit plate 67 and flow into the accelerator 68. The accelerator 68 accelerates the oxygen-containing ions by an electric field toward the stage 69a. The oxygen-containing ions are therefore implanted into the upper surface 12a of the SiC wafer 12. By the ion implantation equipment, an amount of and an implantation depth of the oxygen-containing ions to be implanted into the upper surface 12a of the SiC wafer 12 can be controlled accurately. For example, by setting an acceleration energy of the ions to 10 keV the oxygen-containing ions can be implanted within a depth range of about 0.05 μm from the upper surface 12a. Moreover, a dose of the oxygen-containing ions to be implanted can be controlled, for example, to about $2.3 \times 10^{15}$ atoms/cm$^2$.

In step S8, the upper surface 12a of the SiC wafer 12 is rinsed with a chemical solution to thereby remove a natural oxide film from the upper surface 12a.

Figure 4:
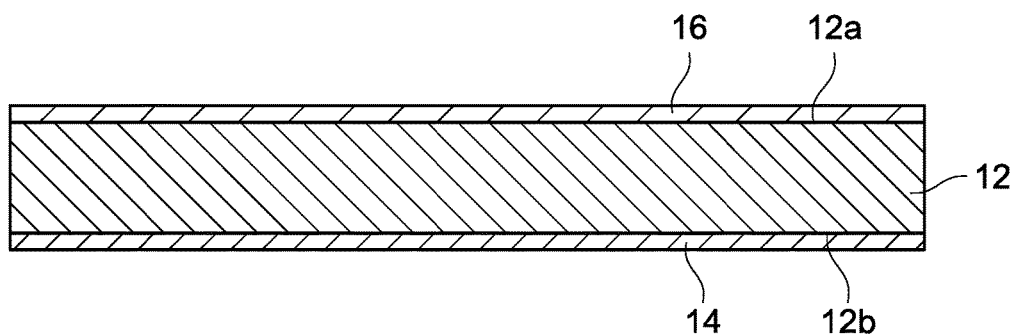
FIG. 4 is a cross-sectional view of the SiC wafer.

In step S10, as shown in FIG. 4, a Schottky electrode 16 (e.g., a metal film made of molybdenum, titanium, nickel, or the like) that makes Schottky-contact with the SiC wafer 12 is formed by sputtering or the like on the upper surface 12a of the SiC wafer 12. Subsequently, the SiC wafer 12 is divided into a plurality of chips, thereby completing semiconductor devices. When the Schottky electrode 16 is formed, the oxygen that was implanted into the SiC wafer 12 in step S6 is captured into a Schottky interface. The Schottky electrode 16 having a greater amount of oxygen implanted into its Schottky interface has a greater barrier height. Since the amount of the oxygen-containing ions to be implanted into the SiC wafer 12 can be controlled accurately according to the ion implantation technique in step S6, the amount of oxygen captured into the Schottky interface in step S10 can be controlled accurately. According to this method, the barrier height of the Schottky electrode 16 can therefore be controlled accurately. According to this method, variations in barrier heights of the Schottky electrodes 16 can therefore be suppressed when the semiconductor devices are mass-produced.

Embodiment 2

Figure 5:
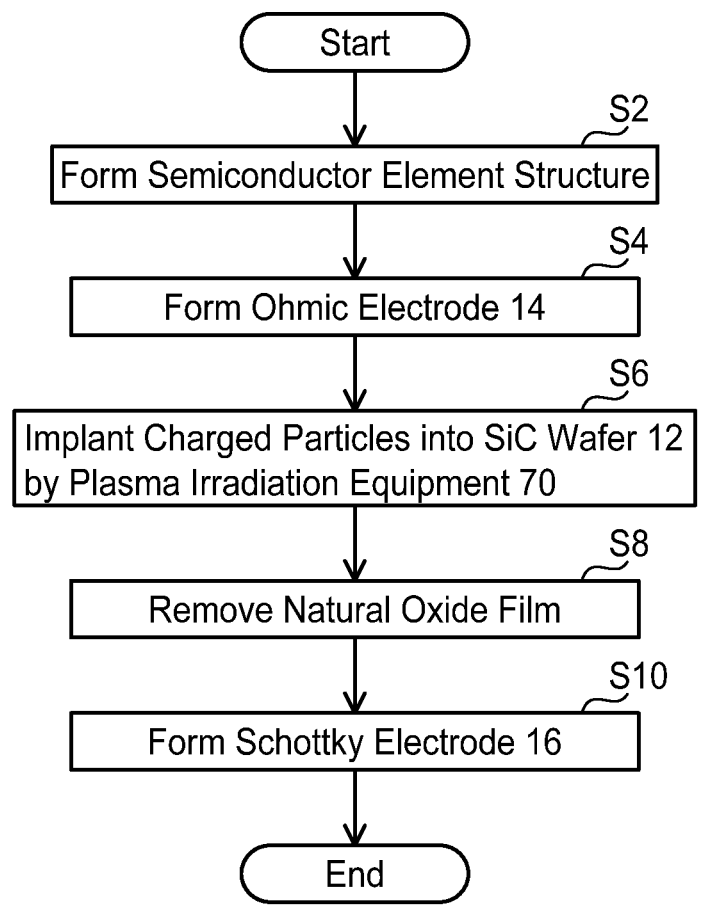
FIG. 5 is a flowchart illustrating a manufacturing method in Embodiment 2.

FIG. 5 illustrates a manufacturing method in Embodiment 2. In Embodiment 2, only step S6 differs from that in Embodiment 1, and other steps S2 to S4 and S8 to S10 are equal to those in Embodiment 1.

Figure 6:
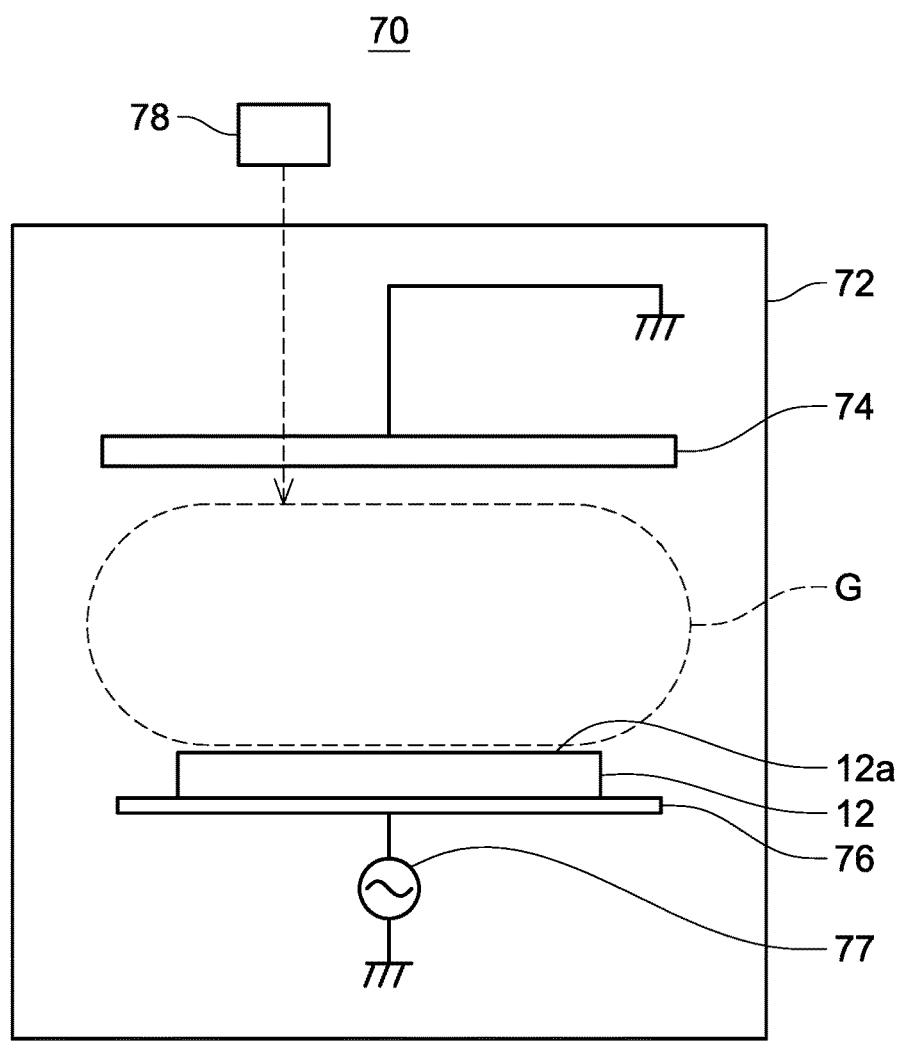
FIG. 6 is a schematic diagram of a plasma irradiation equipment.

In step S6 in Embodiment 2, charged particles are implanted into the upper surface 12a of the SiC wafer 12 by a plasma irradiation equipment 70 shown in FIG. 6. As shown in FIG. 6, the plasma irradiation equipment 70 comprises a chamber 72, an upper electrode 74, a lower electrode 76, a high-frequency power source 77, and a gas supplier 78. The upper and lower electrodes 74 and 76 are provided in the chamber 72. The lower electrode 76 also serves as a stage for mounting the SiC wafer 12. When the plasma irradiation equipment 70 is used, the SiC wafer 12 is mounted on the lower electrode 76 in an orientation that allows the upper surface 12a to be exposed. Next, the chamber 72 is decompressed, and a material gas G including oxygen is supplied from the gas supplier 78 into the chamber 72. Next, the high-frequency power source 77 is used to apply a high-frequency voltage between the upper and lower electrodes 74 and 76. Consequently, the material gas G is decomposed between the upper and lower electrodes 74 and 76, to thereby generate electrons, ions, and radicals, from which plasma is generated. The ions in the plasma include oxygen-containing ions. The upper surface 12a of the SiC wafer 12 is exposed to the plasma. At this occasion, the oxygen-containing ions are implanted into the upper surface 12a of the SiC wafer 12. By the plasma irradiation equipment 70, an amount of the oxygen-containing ions to be implanted into the upper surface 12a of the SiC wafer 12 can be controlled accurately. It should be noted that, a RIE (Reactive Ion Etching) equipment or an ashing equipment can be implemented as the plasma irradiation equipment 70.

Subsequently, steps S8 to S10 are performed similarly to Embodiment 1. When the Schottky electrode 16 is formed in step S10, the oxygen that was implanted into the upper surface 12a in step S6 is captured into the Schottky interface. Since the amount of the oxygen-containing ions to be implanted into the upper surface 12a of the SiC wafer 12 in step S6 can be controlled accurately, the amount of oxygen captured into the Schottky interface in step S10 can be controlled accurately. According to the method in Embodiment 2, the barrier height of the Schottky electrode 16 can therefore be controlled accurately Thus, according to this method, variations in bather heights of the Schottky electrodes 16 can be suppressed when semiconductor devices are mass-produced.

Embodiment 3

Figure 7:
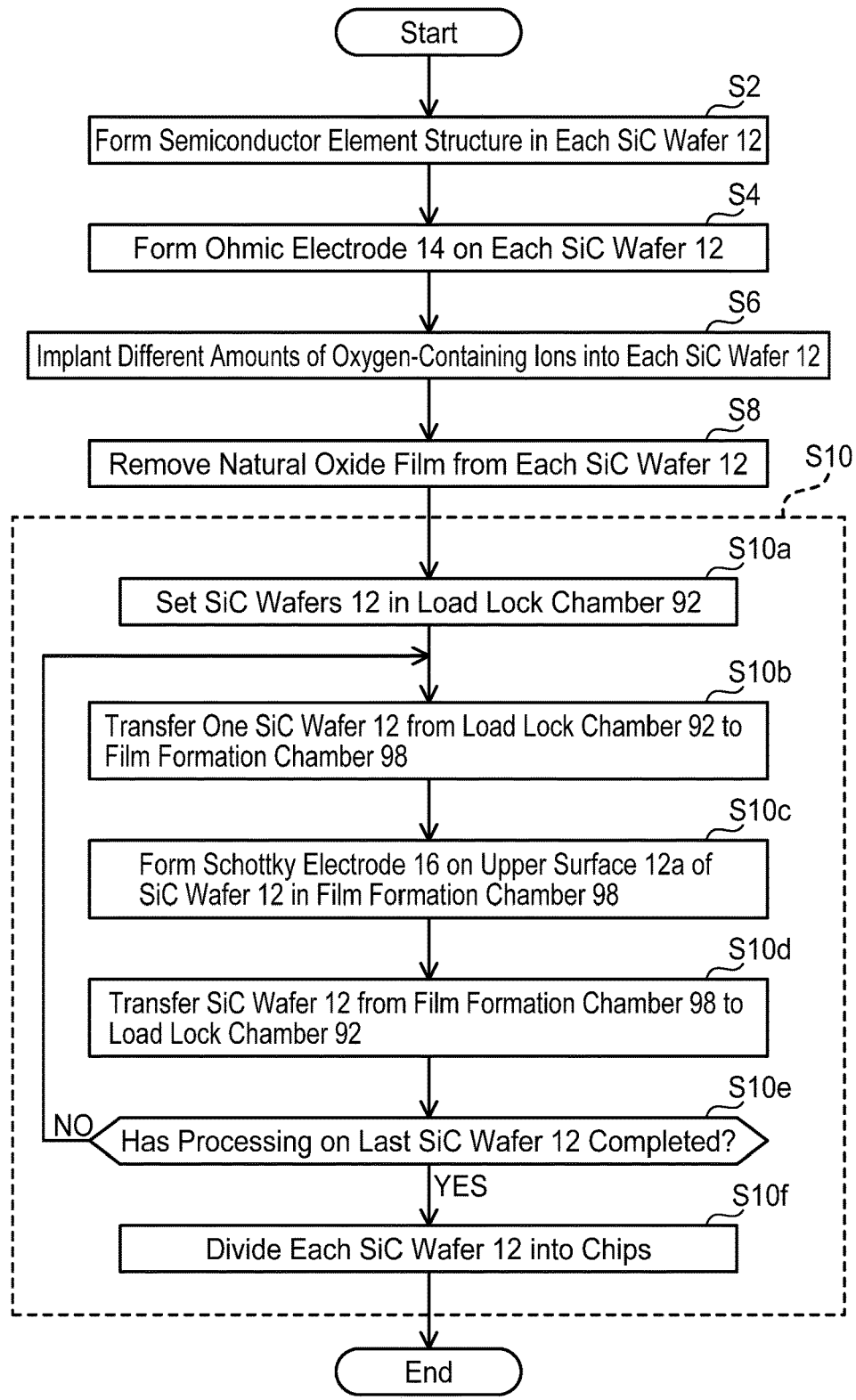
FIG. 7 is a flowchart illustrating a manufacturing method in Embodiment 3.

A method in Embodiment 3 further suppresses variations in barrier heights among a plurality of SiC wafers when the Schottky electrodes 16 are formed on the SiC wafers. FIG. 7 illustrates the manufacturing method in Embodiment 3. Steps S2 to S10 in FIG. 7 correspond to steps S2 to S10 in FIG. 1.

In step S2 in FIG. 7, semiconductor element structures are formed in the plurality of the SiC wafers 12. In step S4 in FIG. 7, the ohmic electrodes 14 are formed on the plurality of the SiC wafers 12. Steps S2 and S4 in FIG. 7 are performed by methods similar to those in steps S2 and S4 in FIG. 1.

In step S6 in FIG. 7, the ion implantation equipment 60 in FIG. 3 is used to implant oxygen-containing ions into each of the upper surfaces 12a of the plurality of the SiC wafers 12. Step S6 in FIG. 7 is performed similarly to step S6 in FIG. 1. It should be noted here that different amounts of oxygen-containing ions are implanted into each of the plurality of the SiC wafers 12. The implantation amount of the oxygen-containing ions can be changed by a duration of the ion implantation, a concentration of the material gas, and the like. It should be noted that, step S6 in FIG. 7 may be conducted by the plasma irradiation equipment in FIG. 6.

In step S8 in FIG. 7, a natural oxide film is removed from each of the upper surfaces 12a of the plurality of the SiC wafers 12. Step S8 in FIG. 7 is performed by a method similar to that in step S8 in FIG. 1.

Figure 8:
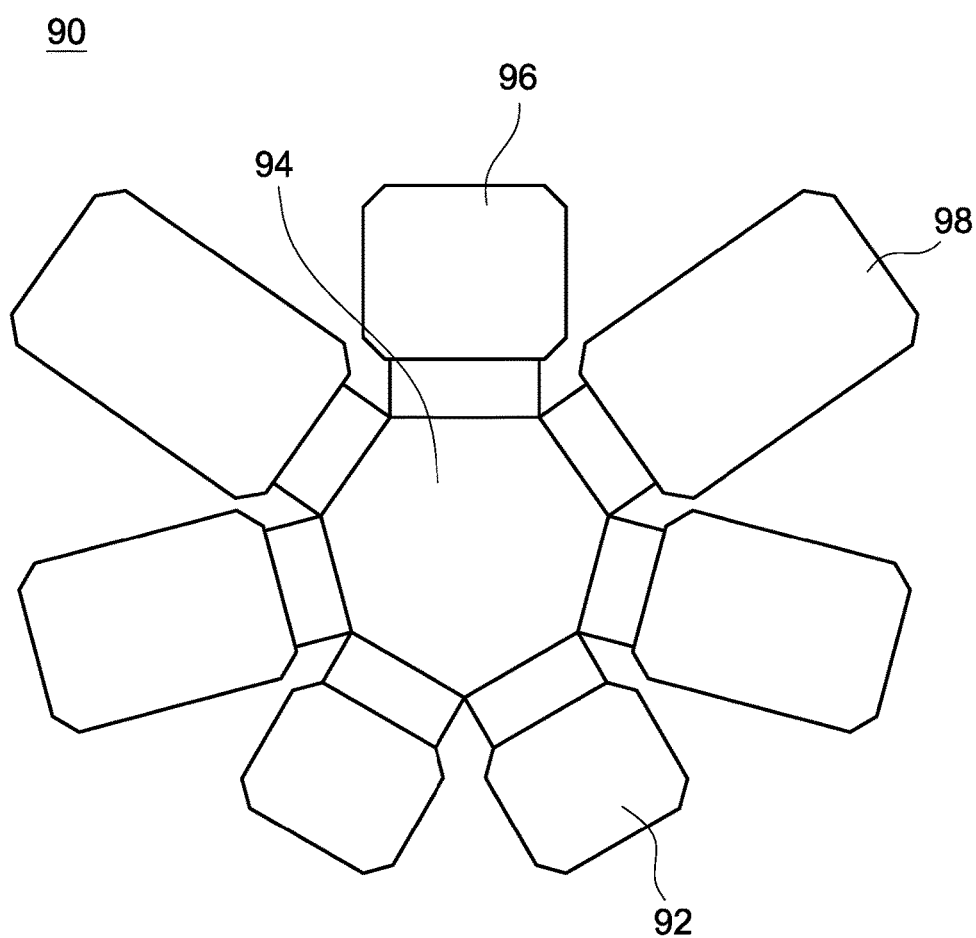
FIG. 8 is a schematic diagram of an electrode forming equipment.

In step S10 in FIG. 7, an electrode forming equipment 90 shown in FIG. 8 is used to form the Schottky electrode 16 on each of the upper surfaces 12a of the plurality of the SiC wafers 12. As shown in FIG. 8, the electrode forming equipment 90 has a load lock chamber 92, a transfer chamber 94, a heating chamber 96, and a film formation chamber 98. It should be noted that, other chambers in the electrode forming equipment 90 are not used in the manufacturing method described below, and hence will not be described. The load lock chamber 92, the heating chamber 96, and the film formation chamber 98 are connected to the transfer chamber 94. Between the transfer chamber 94 and each of other chambers (the load lock chamber 92, the heating chamber 96, and the film formation chamber 98), an openable/closable door is provided. Insides of the load lock chamber 92, the transfer chamber 94, the heating chamber 96, and the film formation chamber 98 can be decompressed. The load lock chamber 92 has a removal port. Via the removal port, the SiC wafer(s) 12 can be transferred from an outside to the load lock chamber 92, and from the load lock chamber 92 to the outside. A transfer equipment for transferring the SiC wafer(s) 12 is provided in the transfer chamber 94. The transfer equipment transfers the SiC wafer (s) 12 between the load lock chamber 92, the heating chamber 96, and the film formation chamber 98. The heating chamber 96 can heat the SiC wafer(s) 12 inside itself. The film formation chamber 98 can form a metal film (a Schottky electrode) on the surface of each SiC wafer 12 inside itself. Step S10 includes steps S10a to S10f.

In step S10a, the plurality of the SiC wafers 12 is set in the load lock chamber 92 of the electrode forming equipment 90. A rack that includes a plurality of slots is provided in the load lock chamber 92. One SiC wafer 12 is set in each slot of the rack. The slots are numbered sequentially from one, respectively. Set in slot 1 is the SiC wafer 12 having a smallest amount of the oxygen-containing ions implanted in step S6. The SiC wafers 12 are set in the respective slots so that the slot with a larger number accommodates the SiC wafer 12 having a greater amount of the oxygen-containing ions implanted in step S6. After the SiC wafers 12 have been set in the respective slots, the load lock chamber 92 is sealed, and inside of which is decompressed. It should be noted that, other chambers (i.e., the transfer chamber 94, the heating chamber 96, the film formation chamber 98, and the like) have already been decompressed.

In step S10b, one of the plurality of the SiC wafers 12 in the load lock chamber 92 is transferred to the film formation chamber 98 by the transfer equipment in the transfer chamber 94. It should be noted that, the SiC wafer 12 is transferred to the film formation chamber 98 via the heating chamber 96. The SiC wafer 12 is preheated in the heating chamber 96 before being transferred to the film formation chamber 98. In step S10b, the SiC wafer 12 provided in the slot with the smallest number, among the SiC wafers 12 before the formation of the electrodes (SiC wafers on which the electrodes have not yet been formed), is transferred to the film formation chamber 98. In step S10c, the Schottky electrode 16 is formed as a film by sputtering or vapor deposition on the upper surface 12a of the SiC wafer 12 transferred into the film formation chamber 98. It should be noted that, the Schottky electrode 16 is not in Schottky-contact with the SiC wafer 12 at this time, and may make Schottky-contact with the SiC wafer 12 by an annealing process that is to be subsequently performed. In step S10d, the SiC wafer 12 after the formation of the Schottky electrode 16 (SiC wafer 12 on which the Schottky electrode 16 has been formed) is transferred from the film formation chamber 98 to the original slot in the load lock chamber 92 by the transfer equipment in the transfer chamber 94. In step S10e, it is determined whether or not the processing on the last SiC wafer 12 (i.e., the SiC water 12 in the slot with the largest number) has been completed. If a determination of NO is made in step S10e, the processing in steps S10b to S10e is repeated.

In the initial step S10b, the SiC wafer 12 in slot 1 is transferred to the film formation chamber 98. In step S10c, the Schottky electrode 16 is formed on the upper surface 12a of the SiC wafer 12. Subsequently, in step S10d, the SiC wafer 12 on which the Schottky electrode 16 has been formed is returned to slot 1. Next, a determination of NO is made in step S10e, and step S10b is executed again. In the next steps S10b to S10e, the Schottky electrode 16 is formed on the SiC wafer 12 in slot 2. By repeating steps S10b to S10e, the Schottky electrodes 16 are respectively formed on the upper surfaces 12a of the SiC wafers 12 in all of the slots. When the formation of the Schottky electrode 16 on the SiC wafer 12 in the last slot is completed, a determination of YES is made in step S10e. In this case, all of the SiC wafers 12 are removed (taken out) from the load lock chamber 92. Subsequently, in step S10f, each of the SiC wafers 12 is divided into chips, and semiconductor devices are completed.

In the manufacturing method in Embodiment 3, when steps S10b to S10e are repeated to form the Schottky electrode 16 on each of the SiC wafers 12, the SiC wafers 12 before the formation of the Schottky electrodes 16 are exposed to a decompressed environment in the load lock chamber 92. Accordingly, while the SiC wafers 12 are waiting in the load lock chamber 92, oxygen leaves the upper surface 12a of each of the SiC wafers 12. The SiC wafer 12 on which the Schottky electrode 16 is formed later in order (i.e., the SiC wafer 12 in the slot with a larger number) waits in the load lock chamber 92 longer. Accordingly, the SiC wafer 12 on which the Schottky electrode 16 is formed later has a larger amount of oxygen leave the upper surface 12a thereof. As mentioned above, however, in the manufacturing method in Embodiment 3, the SiC wafer 12 on which the Schottky electrode 16 is formed later (i.e., the SiC wafer 12 in the slot with a larger number) is the SiC wafer 12 having a greater amount of the oxygen-containing ions implanted in step S6. In other words, the SiC wafer 12 having a greater amount of the oxygen-containing ions implanted in advance waits in the load lock chamber 92 longer, and has a larger amount of oxygen leave. Accordingly, a difference in amount of oxygen that exists on the corresponding upper surface 12a is small between the SiC wafers 12 on which the Schottky electrodes 16 are formed at earlier timings and the SiC wafers 12 on which the Schottky electrodes 16 are formed at later timings. Thus, the difference in amount of oxygen captured into the corresponding Schottky interface is small among the plurality of the SiC wafers 12. As such, in the manufacturing method in Embodiment 3, the amounts of the oxygen-containing ions implanted into the upper surfaces 12a of the SiC wafers 12 are varied in advance in consideration of the respective waiting time durations of the SiC wafers 12 in the load lock chamber 92 (i.e., in consideration of the amounts of oxygen that leaves in the load lock chamber 92). Accordingly, the amounts of oxygen captured into the Schottky interfaces can be equalized among the plurality of the SiC wafers 12. Variations in barrier height of the Schottky electrodes 16 can therefore be suppressed among the plurality of the SiC wafers 12.

It should be noted that, in Embodiment 3 mentioned above, the SiC wafers 12 are transferred to the film formation chamber 98 one by one (i.e., the Schottky electrodes 16 are formed one at a time). However, the SiC wafers 12 may be transferred to the film formation chamber 98 in a manner where a predetermined number of two or more of them are transferred every time (i.e., the Schottky electrodes 16 may be formed a predetermined number of two or more at a time).

It should be noted that, in the technology of forming a portion of a Schottky electrode that makes contact with a SiC wafer with a metal oxide as in Japanese Patent Application Publication No. 2010-225877, the oxygen amount on the Schottky interface is difficult to control accurately, and additionally, the amount of oxygen applied to the Schottky interface is limited. In contrast to this, in the methods in Embodiments 1 to 3 mentioned above, more oxygen can be applied to the Schottky interface than in the method in Japanese Patent Application Publication No. 2010-225877. Thus in each of the methods in Embodiments 1 to 3, an adjustable range of the barrier height has a high upper limit.

Moreover, in the technology of forming a portion of the Schottky electrode that makes contact with the SiC wafer with a metal oxide as in Japanese Patent Application Publication No. 2010-225877, since the metal oxide exists on the Schottky interface, the Schottky electrode has a high resistance. Accordingly, an SBD structure constituted of the Schottky electrode 16 and the SiC wafer 12 has a high forward voltage (ON voltage). In contrast to this, in each of the methods in Embodiments 1 to 3 mentioned above, since almost no metal oxide is formed on the Schottky interface, the resistance of the Schottky electrode can be decreased, and the forward voltage of the SBD structure can be decreased.

Moreover, in Japanese Patent Application Publication No. 2010-225877, molybdenum is oxidized to form a metal oxide. There exist a plurality of types of molybdenum oxides including $MoO_2$, $Mo_2O_5$, $MoO_3$, for example. The type of the oxide thus formed is difficult to control, and the barrier height changes depending on the type of the oxide, and hence the barrier height is difficult to control. In contrast to this, in each of the methods in Embodiments 1 to 3, since almost no metal oxide is formed on the Schottky interface, the barrier height can be controlled more accurately.

Moreover, in the technology of forming a portion of the Schottky electrode that makes contact with the SiC wafer with a metal oxide as in Japanese Patent Application Publication No. 2010-225877, adhesion is poor between the metal oxide (i.e., the Schottky electrode) and the SiC wafer. In other words, the Schottky electrode easily peels off from the SiC wafer. In contrast to this, in each of the methods in Embodiments 1 to 3, since almost no metal oxide is formed on the Schottky interface, good adhesion is achieved between the Schottky electrode and the SiC wafer, and the Schottky electrode is difficult to peel off from the SiC wafer.

Relationships between constituent features in the embodiments and constituent features in the claims will be described. Step S6 in Embodiments 1 to 3 is an example of the implantation of the charged particles in the claims. Step S10 in Embodiments 1 to 3 is an example of the formation of the Schottky electrode in the claims. Step S10a in Embodiment 3 is an example of the setting of the SiC waters in the claims. Steps S10b to S10e in Embodiment 3 are an example of the repetition of the wafer transfer and electrode-formation process in the claims.

Some of the technical components disclosed herein will listed hereinbelow. Each of the below technical components is independently useful.

In an example of the manufacturing method disclosed herein, the charged particles may be implanted into the surface by ion implantation in the implantation of charged particles.

According to this method, the oxygen amount in the Schottky interface can be controlled accurately.

In an example of the manufacturing method disclosed herein, the charged particles may be implanted into the surface by exposing the surface to plasma including the oxygen in the implantation of the charged particles.

According to this method, the oxygen amount in the Schottky interface can be controlled accurately.

In an example of the manufacturing method disclosed herein, the charged particles may be implanted into a plurality of the SiC wafers so that implantation amount of the oxygen varies for each of the SiC wafers in the implantation of charged particles. The formation of the Schottky electrode may comprise: setting the SiC wafers in an electrode forming equipment which comprises a load lock chamber and a film formation chamber, wherein the SiC wafers are set in the load lock chamber; and repeating a wafer-transfer and electrode-formation process of transferring at least one of the SiC wafers from the load lock chamber to the film formation chamber in a state where the load lock chamber and the film formation chamber are decompressed and then forming the Schottky electrode on a surface of the at least one main semiconductor wafer transferred in the film formation chamber. The Schottky electrodes may be formed on the SiC wafers, in the repetition of the wafer-transfer and electrode-formation process, in an order where the Schottky electrode is formed earlier on the SiC wafer with a lower amount of the implanted oxygen than those of remaining SiC wafers.

While the SiC wafers are waiting in the decompressed load lock chamber, oxygen leaves each of the surfaces of the SiC wafers. Accordingly, the longer the waiting time becomes, the amount of oxygen leaving increases. In the method described above, since the Schottky electrodes are formed on the SiC wafers in an order where the Schottky electrode is formed earlier on the SiC wafer with a lower amount of the implanted oxygen than those of remaining SiC wafers, the SiC wafer with a lower amount of the implanted oxygen has a smaller amount of oxygen leave during the waiting time. Accordingly, the difference in oxygen amount in the Schottky interfaces can be suppressed among the SiC wafers that have different waiting time durations. Therefore, variations in barrier heights of the Schottky electrodes can further be suppressed.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A method of manufacturing a semiconductor device, the method comprising:
    implanting charged particles containing oxygen into at least one surface of at least one first silicon carbide (SiC) wafer and at least one surface of at least one second SiC wafer, wherein an amount of the implanted oxygen in the at least one second SiC wafer is greater than that in the at least one first SiC wafer;
    after the implantation of the charged particles, setting the at least one first SiC wafer and the at least one second SiC wafer in a load lock chamber of an electrode forming equipment;
    transferring the at least one first SiC wafer from the load lock chamber to a film formation chamber of the electrode forming equipment in a state where the load lock chamber and the film formation chamber are decompressed;
    forming a first Schottky electrode on the at least one surface of the at least one first SiC wafer in the film formation chamber, wherein the first Schottky electrode is configured to make Schottky contact with the at least one first SiC wafer;
    after the formation of the first Schottky electrode, transferring the at least one second SiC wafer from the load lock chamber to the film formation chamber in a state where the load lock chamber and the film formation chamber are decompressed; and
    forming a second Schottky electrode on the at least one surface of the at least one second SiC wafer in the film formation chamber, wherein the second Schottky electrode is configured to make Schottky contact with the at least one second SiC wafer.

2. The method of claim 1, wherein the implantation of the charged particles is performed using an ion implantation equipment comprising:
    an ion source configured to generate the charged particles; and
    an accelerator configured to accelerate the charged particles that have flowed from the ion source and into the accelerator toward the at least one first SiC wafer and the at least one second SiC wafer so that the charged particles are implanted into the at least one surface of the at least one first SiC wafer and the at least one surface of the at least one second SiC wafer, wherein the charged particles are accelerated by an electric field.

* * * * *